United States Patent [19]

Numata et al.

[11] Patent Number: 5,970,006
[45] Date of Patent: Oct. 19, 1999

[54] SEMICONDUCTOR MEMORY DEVICE HAVING CELL ARRAY DIVIDED INTO A PLURALITY OF CELL BLOCKS

[75] Inventors: Kenji Numata, Yamato; Syuso Fujii, Kawasaki, both of Japan

[73] Assignee: Kabushiki Kaisha Toshiba, Kawasaki, Japan

[21] Appl. No.: 09/182,892

[22] Filed: Oct. 30, 1998

Related U.S. Application Data

[63] Continuation of application No. 08/959,466, Oct. 28, 1997, Pat. No. 5,862,090, which is a continuation of application No. 07/944,729, Sep. 15, 1992, Pat. No. 5,734,619, which is a continuation of application No. 07/608,732, Nov. 5, 1990, abandoned.

[30] Foreign Application Priority Data

Nov. 13, 1989 [JP] Japan .................................. 1-292162

[51] Int. Cl.$^6$ ..................................................... G11C 7/00
[52] U.S. Cl. ............................ 365/203; 365/190; 365/204
[58] Field of Search .............................. 365/203, 230.03, 365/190, 205, 207, 208, 204

[56] References Cited

U.S. PATENT DOCUMENTS

5,671,187  9/1997  Childers et al. ......................... 365/205
5,729,498  3/1998  Yih et al. ................................ 365/203
5,734,619  3/1998  Numata et al. ..................... 365/230.03
5,740,113  4/1998  Kaneko ................................ 365/189.11
5,796,665  8/1998  Ternullo, Jr. et al. ................. 365/203
5,862,090  1/1999  Numata et al. .......................... 365/203

Primary Examiner—Son Mai
Attorney, Agent, or Firm—Oblon, Spivak, McClelland, Maier & Neustadt, P.C.

[57] ABSTRACT

A semiconductor memory device includes a cell array having a plurality of memory cells grouped into a plurality of cell blocks and arranged in a matrix form, a plurality of word lines, a plurality of bit lines, bit line sense amplifiers (S/A), a cell block selection circuit, a plurality of data I/O lines, row decoders, a plurality of column selection signal lines, column decoders and a data buffer circuit. The data buffer circuit includes a first precharge circuit, connected to the data I/O lines, for precharging the data I/O lines to the same potential as a precharge potential of the bit lines, a second precharge circuit, connected to the data I/O lines, for precharging the data I/O lines to a potential different from the precharge potential of the bit lines, and selective drive circuit for generating control signals to be supplied to the first and second precharge circuit, and selectively driving the first and second precharge circuits to sense the data read out to the data I/O lines on the basis of the control signals.

10 Claims, 9 Drawing Sheets

SEMICONDUCTOR MEMORY DEVICE HAVING CELL ARRAY DIVIDED INTO A PLURALITY OF CELL BLOCKS

This application is a Continuation of application Ser. No. 08/959,466 Filed on Oct. 28, 1997, now U.S. Pat. No. 5,862,090 which is a continuation of U.S. Ser. No. 07/944,729 filed Sep. 19, 1992 is now U.S. Pat. No. 5,734,619 which is a Continuation of U.S. Ser. No. 07/608,732 filed Nov. 5, 1990, abandoned.

BACKGROUND OF THE INVENTION

1. Field of the Invention

The present invention relates to a semiconductor memory device such as a high integrated DRAM having a cell array divided into a plurality of cell blocks, wherein cell block selection is performed.

2. Description of the Related Art

In order to form a highly integrated DRAM, micro-patterning of elements and lines must be realized, and a cell array and a cell array drive circuit must be efficiently laid out within a predetermined chip area. In addition, the reading rate of cell data must be increased by decreasing a ratio $C_B/C_S$ of the capacity $C_S$ of a memory cell to a capacity $C_B$ of bit lines. Furthermore, in order to reduce the power consumption due to charge/discharge of bit lines, the cell array must be divided into a plurality of cell blocks in the bit line direction. A highly integrated DRAM using a divided bit line and common Y-decoder method is inevitably required to satisfy these demands.

In order to realize this method, for example, a cell array is divided into four or eight cell blocks in the bit line direction. Bit lines in the respective cell blocks are independent of each other. A data I/O line shared by two cell blocks is arranged between two adjacent cell blocks. The bit lines in a selected one of the two adjacent cell blocks are connected to a data I/O line through a block selection gate and a column selection gate. A column selection signal line for controlling a column selection gate is continuously formed by a metal wire on the cell array constituted by the plurality of divided cell blocks, and a column selection signal as an output from a Y-decoder (i.e., column decoder) is supplied to the column selection signal line. A method of sharing at least part of a sense amplifier for bit line between adjacent cell blocks, i.e., a common sense amplifier method, is normally employed.

In a bit line precharge system of such a DRAM, it is known that an effective measure to reduce the power consumption and increase the speed of a bit line sense operation is to precharge bit lines at (½)Vcc.

A data I/O line, however, is preferably precharged to Vcc for the following reasons. First, assuming that the I/O line is precharged to the same potential as that of the bit lines, i.e., (½)Vcc, when a memory cell of a selected cell block is re-stored, an electric potential on bit line tends to be pulled up to an I/O line potential. A bit line sense amplifier is normally constituted by an NMOS sense amplifier and a PMOS sense amplifier. The NMOS sense amplifier is used to amplify a small signal. The PMOS sense amplifier is used to raise the potential of an "H"-level bit line to Vcc.

For this reason, the drive power of the PMOS sense amplifier is not originally set to be large. Therefore, when a bit line is electrically connected to an I/O line potential, since the electric potential on bit line is pulled up to the I/O line, the PMOS sense amplifier cannot satisfactorily raise the "H"-level bit line potential to Vcc. This phenomenon becomes conspicuous especially when an I/O line has a large capacity, and abnormal operations may be caused. Second, if an I/O line can be precharged to Vcc, the initial sensing time of the I/O line of circuit of a bit line sense amplifier can be shortened.

The conventional DRAM of the divided bit line and common Y-decoder method, however, does not employ the precharge method, in which bit lines are precharged to (½)Vcc and an I/O lines are precharged to Vcc, for the following reason. Each column selection signal line is continuously arranged across a plurality of cell blocks and is connected to the column selection gates of the respective cell blocks. With this arrangement, when a given column selection signal is selected, the column selection gates of non-selected cell blocks which data should be not read out are opened. Subsequently, bit line sense amplifiers located outside the selection gates of the non-selected cell blocks and precharged to (½)Vcc are connected to I/O lines precharged to Vcc. As a result, the precharge potentials of the bit line sense amplifier is subjected to breakdown. The precharge method has not been employed for the above-described reason.

As described above, in the conventional DRAM of the divided bit line and common Y-decoder method, the precharge potential of each bit line cannot be set to be (½)Vcc and the precharge potential of each I/O line cannot be set to be Vcc. This interferes with realization of a further reduction in power consumption and an increase in operation speed.

SUMMARY OF THE INVENTION

It is an object of the present invention to provide a DRAM of a divided bit line and common Y-decoder method, which can employ a precharge method in which each bit line is precharged to (½)Vcc and each I/O line is precharged to Vcc, so as to realize an increase in operation speed and a reduction in power consumption.

The characteristic feature is that DRAM formed in accordance with the present invention comprises:

a cell array including
  a plurality of memory cells grouped into a plurality of cell blocks and arranged in a matrix form,
  a plurality of word lines, arranged in each of the cell blocks in a column direction, for driving the memory cells in the column direction,
  a plurality of bit lines, arranged to cross the word lines, for transferring data to/from the selected memory cells, and
  bit line sense amplifiers respectively connected to the bit lines;

a cell block selection circuit for selecting one of the plurality of cell blocks of the cell array on active cycle;

a plurality of data I/O lines to which the bit lines in the cell block selected by the cell block selection circuit are connected through column selection gates;

row decoders for selectively driving the word lines;

a plurality of column selection signal lines arranged across the plurality of cell blocks of the cell array and connected to the column selection gates of the cell blocks;

column decoders for transferring column selection signals to the column selection signal lines; and a data buffer circuit, connected to the respective data I/O lines, for sensing data read out to the respective data I/O lines, the data buffer circuit including a first precharge circuit, connected to the data I/O lines, for precharging the data I/O lines at the same potential as a precharge potential of the bit lines, a second precharge circuit, connected to the data I/O lines, for precharging the data I/O lines at a potential different from the precharge potential of the bit lines, and a selective drive circuit for selecting one of the first and second precharge circuits and driving the selected circuit.

In addition, a DRAM of the present invention comprises:

a cell array including a plurality of memory cells grouped into a plurality of cell blocks and arranged in a matrix form, a plurality of word lines, arranged in each of the cell blocks in a column direction, for driving the memory cells in the column direction, a plurality of bit lines, arranged to cross the word lines, for transferring data to/from the selected memory cells, and bit line sense amplifiers respectively connected to the bit lines;

a cell block selection circuit for selecting one of the plurality of cell blocks of the cell array on active cycle;

a plurality of data I/O lines to which the bit lines in the cell block selected by the cell block selection circuit are connected through column selection gates;

row decoders for selectively driving the word lines;

a plurality of column selection signal lines arranged across the plurality of cell blocks of the cell array and connected to the column selection gates of the cell blocks;

column decoders for transferring column selection signals to the column selection signal lines; and a selection gate control circuit which is arranged between the column selection signal lines and the selection gates and is controlled by a control signal from the cell block selection circuit to transfer the column selection signal to the selected column selection gate.

According to the present invention, with regard to bit lines and data I/O lines connected to each other on active cycle, the following two states can be obtained: a state wherein the precharge potential of the bit lines is ($\frac{1}{2}$)Vcc, and a state wherein the precharge potential of the data I/O lines is Vcc.

According to the first aspect of the present invention, all the data I/O lines on precharge cycle and non-selected data I/O lines on active cycle are set at the same precharge potential as that of the bit lines, i.e., ($\frac{1}{2}$)Vcc. In addition, only data I/O lines selected on active cycle are selectively precharged to Vcc.

According to the second aspect of the present invention, the precharge potential of all the data I/O lines is set at Vcc, and only the column selection blocks of a cell block selected on active cycle can be opened. With this operation, in the selected cell block, the data I/O lines precharged to Vcc are connected to the bit lines precharge at ($\frac{1}{2}$)Vcc.

In either of the first and second aspects, therefore, a relationship in potential between non-selected cell block areas is not broken. In addition, since the precharge potential of each bit line from which data is read out is set to be ($\frac{1}{2}$)Vcc and the precharge potential of a data I/O line is connected thereto is set to be Vcc, a high-speed data read operation can be performed.

As described above, according to the present invention, both the method of precharging bit lines to ($\frac{1}{2}$)Vcc and the method of precharging data I/O lines to Vcc can be used.

Therefore, there is provided a highly integrated DRAM which can realize a reduction in power consumption and in chip size without decreasing the operation speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A DRAM according to the first embodiment of the present invention will be described below with reference to FIGS. 1 to 5.

Figure 1:
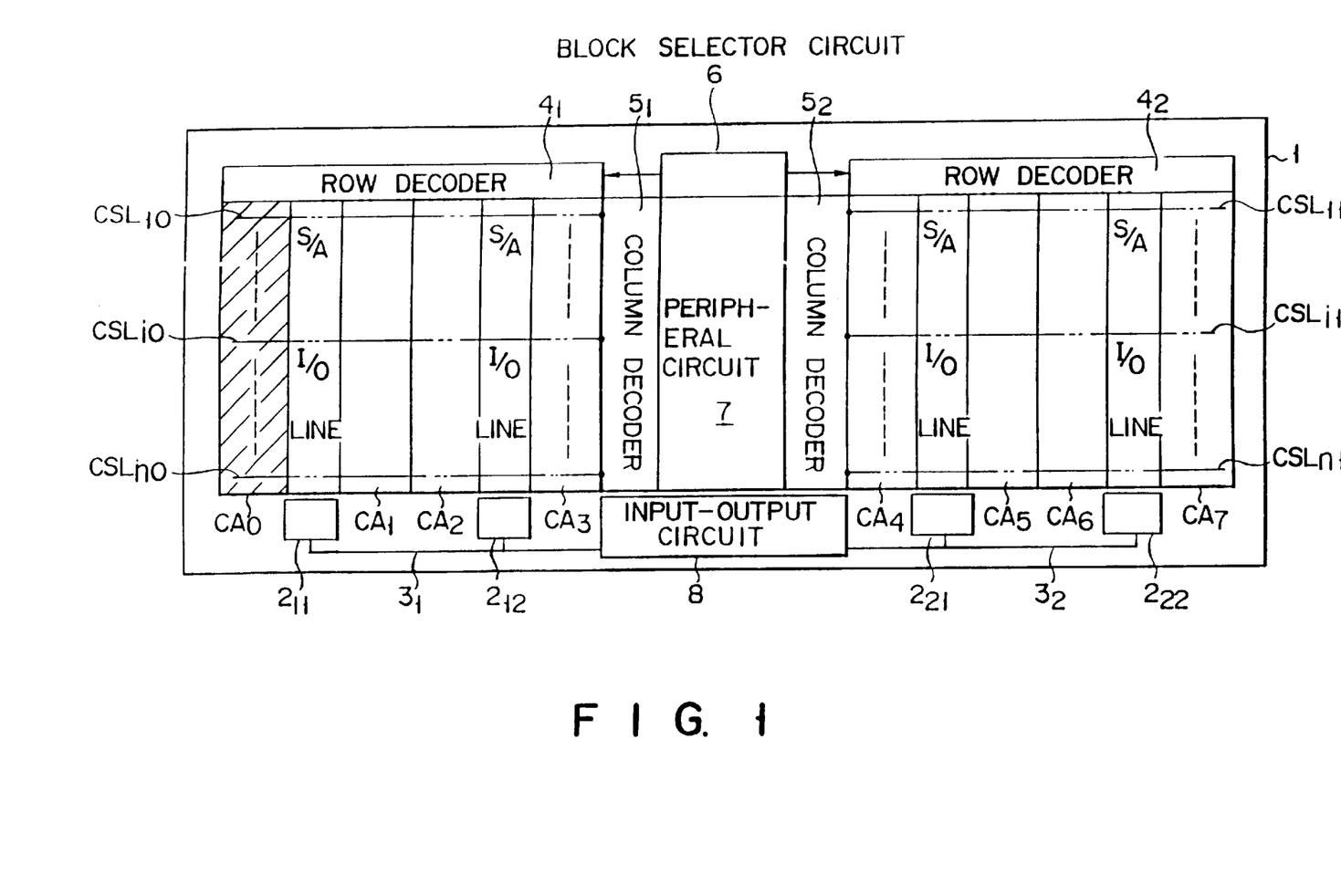
FIG. 1 is a schematic diagram showing a chip layout of a DRAM of a divided bit line and common Y-decoder method according to the first embodiment of the present invention.
Figure 2:
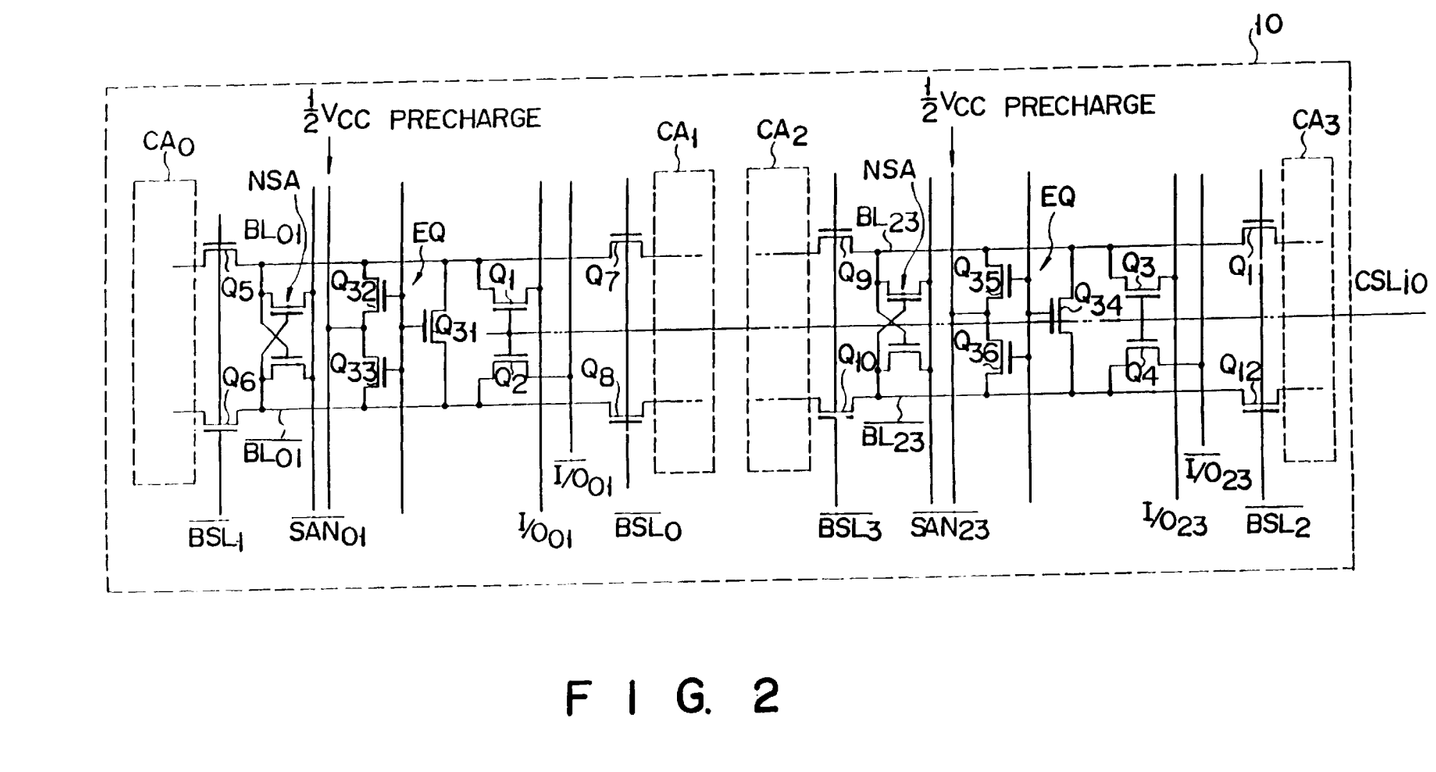
FIG. 2 is a circuit diagram showing a one-column portion of a typical subcell array in the first embodiment.
Figure 3:
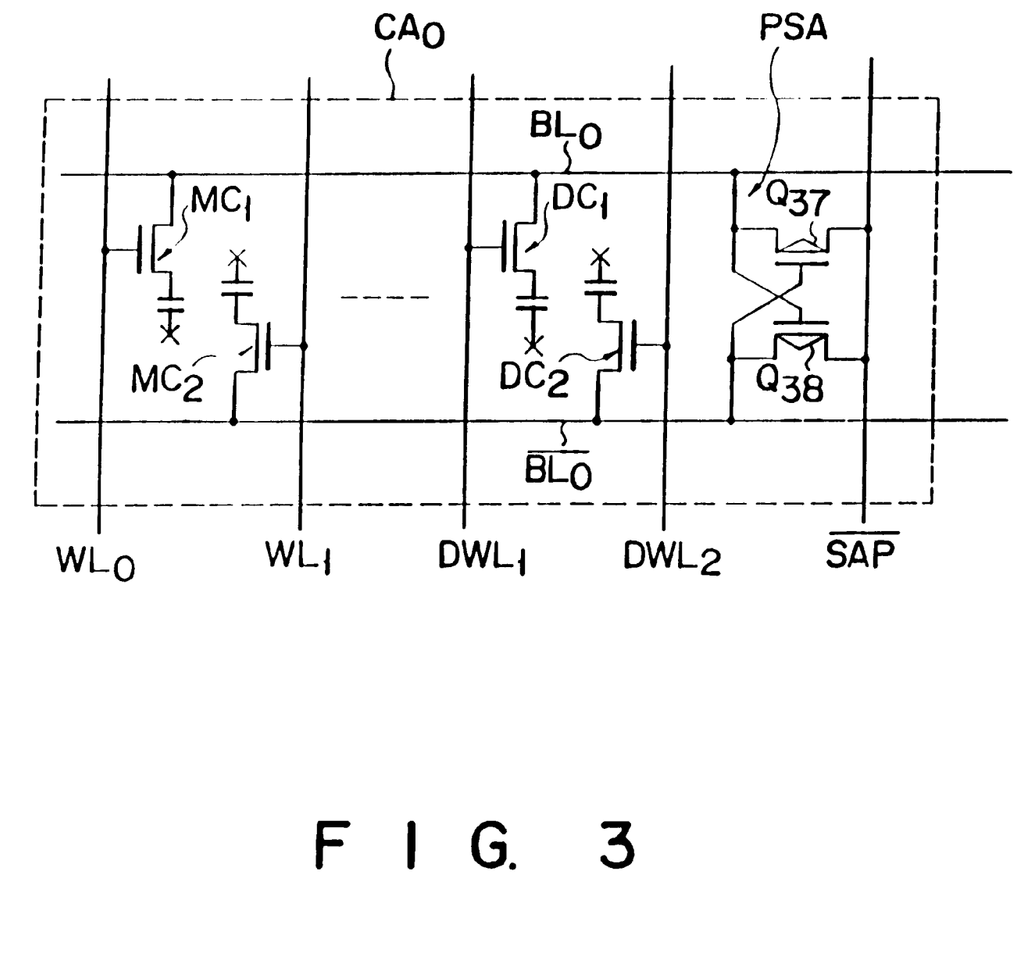
FIG. 3 is a circuit diagram showing one cell block of the subcell array.

FIG. 1 shows a schematic chip layout of a DRAM of a divided bit line and common Y-decoder method, in which a cell array is divided into eight cell blocks. FIG. 2 shows an arrangement of a one-column portion of adjacent four cell blocks in FIG. 1. FIG. 3 shows an arrangement of one cell block in FIG. 2.

As shown in FIG. 1, a cell array arranged on a DRAM chip 1 is divided into eight cell blocks $CA_0$ to $CA_7$ in a bit line direction. These cell blocks $CA_0$ to $CA_7$ are grouped into two areas, i.e., an area including the cell blocks $CA_0$ to $CA_3$, and an area including the cell blocks $CA_4$ to $CA_7$. Row decoders $4_1$ and $4_2$ for selectively driving word lines are respectively arranged at end portions of the area the cell blocks $CA_0$ to $CA_3$ and of the area including the cell blocks $CA_4$ to $CA_7$. Column selection signal lines $CSL_{i0}$ (i=1, 2, . . . , n) are continuously arranged on the four cell blocks $CA_0$ to $CA_3$ on the left side. Column selection signal lines $CSL_{i1}$ (i=1, 2, . . . , n) are continuously arranged on the four cell blocks $CA_0$ to $CA_3$ on the left side. Column selection signal lines $CSL_{i1}$ (i=1, 2, . . . , n) are continuously arranged on the four cell blocks $CA_4$ to $CA_7$ on the right side. Column decoders $5_1$ and $5_2$ for performing column selection are arranged at end portions of these column selection signal lines $CSL_{i0}$ and $CSL_{i1}$. More specifically, one column decoder $5_1$ is shared by the four cell blocks $CA_0$ to $CA_3$ on the left side, whereas the other column decoder $5_2$ is shared by the four cell blocks $CA_4$ to $CA_7$ on the right side.

In this DRAM, a bit line sense amplifier S/A and a data I/O line are arranged between the cell blocks $CA_0$ and $CA_1$. The bit line sense amplifier S/A and the data I/O line are shared by these cell blocks. Similarly, bit lines and data I/O lines are respectively arranged between the cell blocks $CA_2$ and $CA_3$, between the cell blocks $CA_4$ and $CA_5$, and between $CA_6$ and $CA_7$. The I/O lines on the left side are connected to a data line $3_1$ through I/O buffer sections $2_{11}$ and $2_{12}$, respectively. The I/O lines on the right side are connected to a data line $3_2$ through I/O buffer sections $2_{21}$ and $2_{22}$, respectively. These data lines $3_1$ and $3_2$ are connected to an external terminal through an input-output circuit 8.

A peripheral circuit 7 including an address buffer, an RAS control circuit, a CAS control circuit, and the like, and a cell block selector circuit 6 to be controlled by the peripheral circuit 7 are arranged between the two column decoders $5_1$ and $5_2$. The cell block selector circuit 6 has a function of selecting one cell block on active cycle.

FIG. 2 shows a cell array in more detail. FIG. 2 shows a detailed arrangement of a one-column portion of a subcell array 10 constituted by the four cell blocks $CA_0$ to $CA_3$ on the left side. FIG. 3 shows a detailed arrangement of the one cell block $CA_0$ in FIG. 2. In this embodiment, a cell array has a folded bit line structure.

A description will be made below in consideration of the cell block $CA_0$. As shown in FIG. 3, a large number of memory cells $MC_1$, $MC_2$, . . . each having a one-transistor/one-capacitor structure are respectively connected to a pair of bit lines $BL_0$ and $\overline{BL_0}$. Dummy cells $DC_1$ and $DC_2$ are respectively connected to the bit lines $BL_0$ and $\overline{BL_0}$. Word lines $WL_1, WL_2, \ldots$ for selectively driving the memory cells $MC_1, MC_2, \ldots$, and dummy word lines $DWL_1$ and $DWL_2$ for selectively driving the dummy cells $DC_1$ and $DC_2$ are arranged to cross the bit lines $BL_0$ and $\overline{BL_0}$. These word lines and dummy word lines are designed to simultaneously drive memory cells and dummy cells corresponding to other columns.

A description will be made below in consideration of the cell blocks $CA_0$ and $CA_1$. Each bit line sense amplifier S/A comprises a PMOS sense amplifier PSA constituted by a PMOS flip-flop, and an NMOS sense amplifier NSA constituted by an NMOS flip-flop. Of these sense amplifiers, the PMOS sense amplifier PSA is arranged in each of the cell blocks $CA_0$ and $CA_1$. The NMOS sense amplifier NSA is arranged outside the cell blocks $CA_0$ and $CA_1$ so as to be shared by the two adjacent cell blocks $CA_0$ and $CA_1$. Block selection gates $Q_5$ and $Q_6$ to be controlled by a block selection signal $\overline{BSL_1}$ are respectively arranged between the internal bit lines $BL_0$ and $\overline{BL_0}$ in the cell block $CA_0$, and between external bit lines $BL_{01}$ and $\overline{BL_{01}}$ which the common NMOX sense amplifier NSA is arranged. Similarly, block selection gates $Q_7$ and $Q_8$ to be controlled by a block selection signal $BSL_0$ are respectively connected between the cell block $CA_1$ and the external bit lines $BL_{01}$ and $BL_{01}$.

A bit line equalization circuit EQ shared by the two cell blocks $CA_0$ and $CA_1$ is arranged between the bit lines $BL_{01}$ and $\overline{BL_{01}}$ on the right side of the common NMOS sense amplifier NSA. The bit line equalization circuit EQ comprises an equalization MOS transistor $Q_{31}$ for short-circuiting the bit lines $BL_{01}$ and $\overline{BL_{01}}$ as a pair, and precharge MOS transistors $Q_{32}$ and $Q_{33}$ for setting these bit lines $BL_{01}$ and $\overline{BL_{01}}$ to a precharge potential (½)Vcc. The bit lines $BL_{01}$ and $\overline{BL_{01}}$ having the common NMOS sense amplifier NSA arranged therebetween are respectively connected to data I/O lines I/O and $\overline{I/O}$ through the column selection gates $Q_1$ and $Q_2$. The cell blocks $CA_2$ and $CA_3$ adjacent to these cell blocks $CA_0$ and $CA_1$ have the same arrangement as described above.

The column selection signal lines $CSL_{i0}$ for transmitting column selection signals from the column decoder are arranged across the area of the four cell blocks $CA_0$ to $CA_3$. The column selection signals $CSL_{i0}$ are connected to the column selection gates $Q_1$, $Q_2$, $Q_3$, and $Q_4$ of the four cell blocks $CA_0$ to $CA_3$ so as to simultaneously drive these column selection gates.

Figure 4:
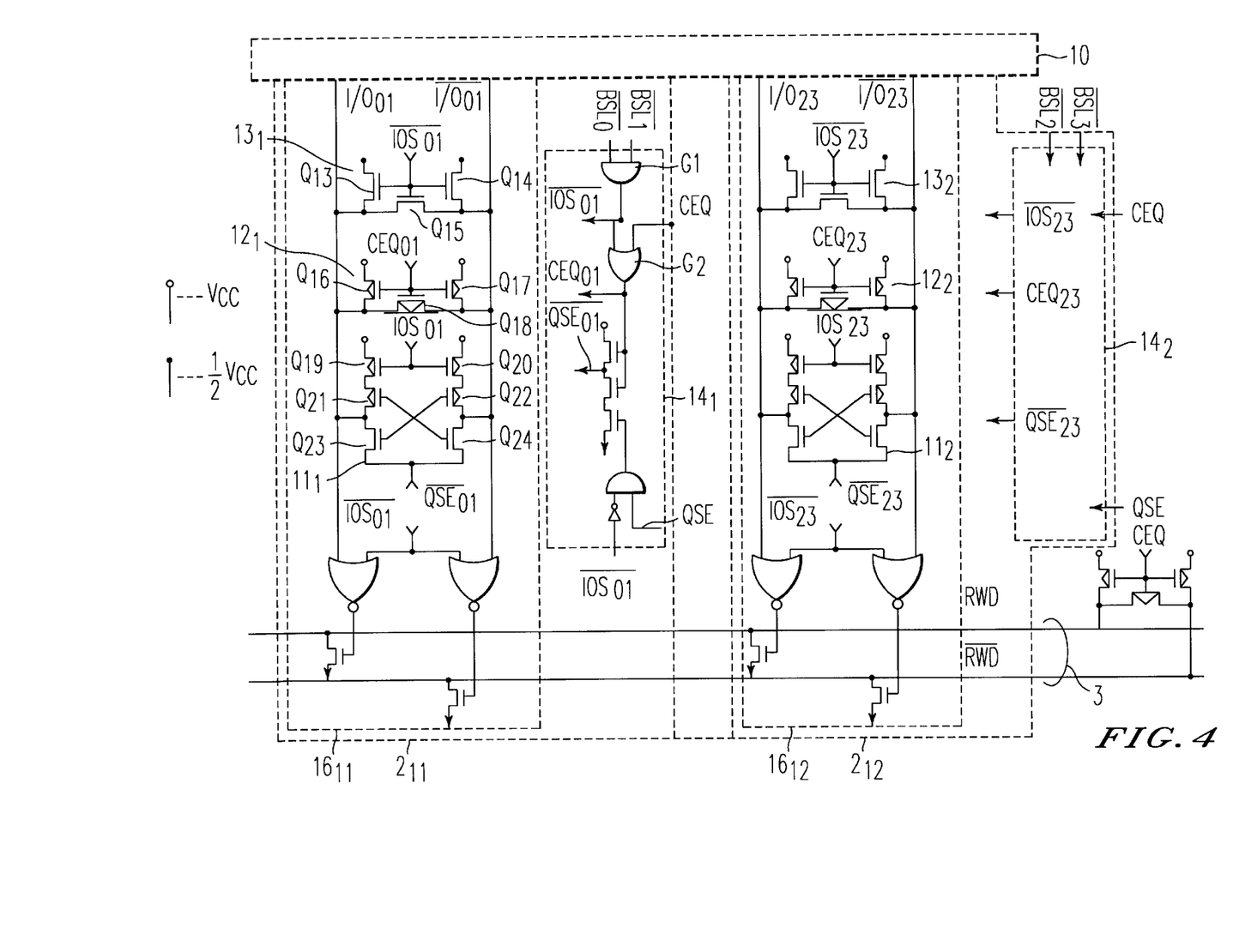
FIG. 4 is a circuit diagram showing a data I/O buffer section connected to data I/O lines.

FIG. 4 shows a detailed arrangement of an I/O buffer section connected to the above-described subcell array 10. With regard to the cell blocks $CA_0$ and $CA_1$, the I/O buffer section includes an I/O buffer $16_{11}$ and an I/O buffer control circuit $14_1$. The I/O buffer $16_{11}$ having a sense amplifier ill is connected to a pair of I/O lines $I/O_{01}$ and $\overline{I/O_{01}}$ commonly provided for the adjacent cell blocks $CA_0$ and $CA_1$. This I/O buffer $16_{11}$ includes a first I/O line precharge circuit $13_1$ for precharging the I/O lines $I/O_{01}$ and $\overline{I/O_{01}}$ to the same potential (½)Vcc as that of the bit lines, and a second I/O precharge circuit $12_1$ for precharging the I/O lines $I/O_{01}$ and $\overline{I/O_{01}}$ to the potential Vcc higher than (½)Vcc.

The first precharge circuit $13_1$ comprises an equalization n-channel MOS transistor $Q_{15}$ for short-circuiting the I/O lines $I/O_{01}$ and $\overline{I/O_{01}}$, and precharge n-channel MOS transistors $Q_{13}$ and $Q_{14}$ for setting the I/O lines $I/O_{01}$ and $\overline{I/C_{01}}$ to (½)Vcc. The second precharge circuit 121 comprises an equalization p-channel MOS transistor $Q_{18}$ and precharge p-channel MOS transistors $Q_{16}$ and $Q_{17}$.

The I/O buffer control circuit $14_1$ selectively drives the I/O buffer $16_{11}$ by using a precharge control signal CEQ and a sense control signal QSE.

An I/O buffer $16_{12}$ including an I/O sense amplifier $11_2$ is connected to a pair of I/O lines $I/O_{23}$ and $\overline{I/O_{23}}$ commonly provided for other two cell blocks $CA_2$ and $CA_3$ in the same manner as described above. The I/O buffer $16_{12}$ includes first and second I/O precharge circuits $13_2$ and $12_2$. An I/O buffer control circuit $14_2$ is provided for the I/O buffer $16_{12}$.

The cell block selection signals $\overline{BSL_0}$ and $\overline{BSL_1}$ are input to the I/O buffer control circuit $14_1$ as control signals. Cell block selection signals $\overline{BSL_2}$ and $\overline{BSL_3}$ are input to the I/O buffer control circuit $14_2$ as control signals. With this arrangement, when the cell block $CA_0$ or $CA_1$ is selected, i.e., the signal $\overline{BSL_0}$ is $\overline{BSL_1}$ is set at "L" level, a control signal IOS01 is set at "L" level, and the I/O sense amplifier $11_1$ in the I/O buffer $16_{11}$ is activated. At this time, in the I/O buffer $16_{11}$, the control signal $\overline{IOS_{01}}$ sets the first I/O line precharge circuit $13_1$ for (½)Vcc precharge in an inactive state, and the control signal $\overline{CEQ_{01}}$ sets the second I/O line precharge circuit $12_1$ for Vcc precharge in an active state. At this time, since an "H"-level control signal $\overline{IOS_{23}}$ is supplied to the I/O sense amplifier $11_2$ in the other I/O buffer $16_{12}$, the I/O sense amplifier 112 is not activated. The control signal $\overline{IOS_{23}}$ sets the first I/O line precharge circuit $13_2$ for (½)Vcc precharge in an active state, and the control signal $\overline{CEQ_{23}}$ sets the second I/O line precharge circuit $12_2$ for Vcc precharge in an inactive state. If the cell block $CA_2$ or $CA_3$ is selected, the above-described relationship is reversed.

These I/O buffers are connected to the input-output circuit 8 through read/write data lines 3.

Figure 5:
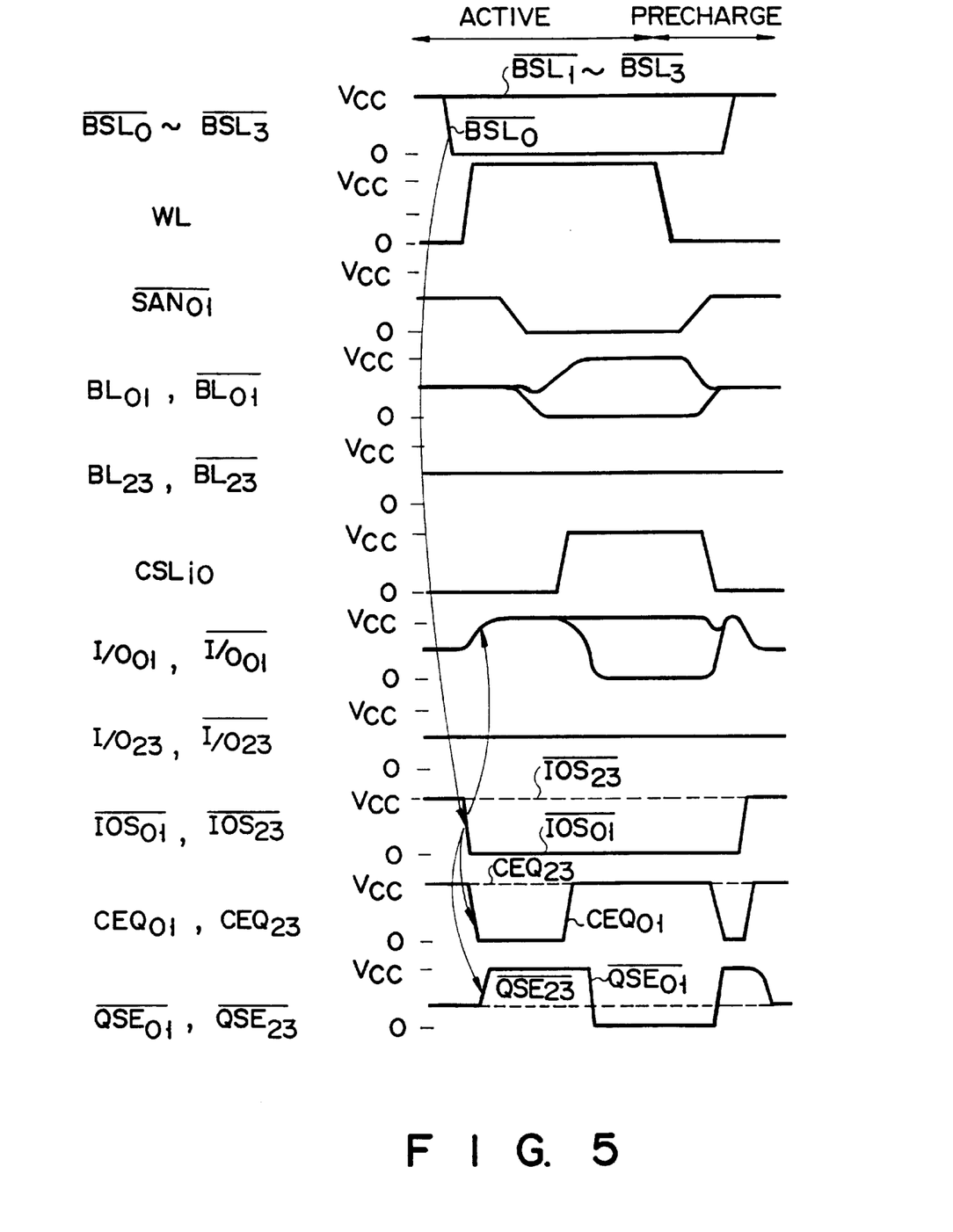
FIG. 5 is a timing chart for explaining an operation of the DRAM according to the first embodiment.

An operation of the DRAM of the divided bit line and common-Y decoder method having the above-described arrangement will be described with reference to a timing chart in FIG. 5, in which the cell block $CA_0$ of the eight cell blocks $CA_0$ to $CA_7$ is selected as indicated by a hatched portion in FIG. 1, and the data I/O line $I/O_{01}$ and $\overline{I/O_{01}}$ are activated. Note that FIG. 5 shows the operation waveforms of the respective signals when the subcell array 10 consisting of the four cell block $CA_0$ to $CA_3$ is taken into consideration.

The block selection signals $\overline{BSL_0}$ to $\overline{BSL_3}$ are at "H" level (i.e., Vcc) before they are set on active cycle. Therefore, all the cell block selection gates $Q_5$ to $Q_{12}$ are in an ON state. When a row address is determined, for example, one block selection signal $\overline{BSL_0}$ is set at "L" level. As a result, the block selection gates $Q_7$ and $Q_8$ are set in an OFF state, the cell block $CA_1$ of the two cell blocks $CA_0$ and $CA_1$ sharing the NMOS sense amplifier NSA is disconnected from the NMOS sense amplifier NSA. At the same time, the buffer control circuit $14_1$ of the I/O buffer section $2_{11}$ receives the "L"-level block selection signal $\overline{BSL_0}$ and the "H"-level block selection signal $\overline{BSL_1}$. The I/O selection $\overline{IOS_{01}}$ is set at "L" level by an AND gate $G_1$, so that the first precharge circuit $13_1$ for (½)Vcc precharge in the I/O buffer $16_{11}$ is not operated. In addition, the precharge control signal $\overline{CEQ}$ of "L" level and the I/O selection signal $\overline{IOS_{01}}$ of "L" level are input to an OR gate $G_2$ so as to set the precharge control signal $\overline{CEQ_{01}}$ at "L" level. As a result, the second precharge circuit 121 for Vcc precharge is activated. Furthermore, the potential of the sense signal $\overline{QSE_{01}}$ is raised from (½)Vcc to Vcc by the I/O selection signal $\overline{IOS_{01}}$ of "L" level and the sense control signal QSE of "L" level. Hence, the reference electric potential of the I/O sense amplifier $11_1$ is increased to Vcc. With this operation, the I/O lines $I/O_{01}$ and $\overline{I/O_{01}}$ which have been precharged to (½)Vcc are precharged to Vcc.

Meanwhile, a word line selected by the row decoder $4_1$ is activated so that data of a memory cell arranged along the selected word line in the cell block $CA_0$ and of a dummy cell arranged along a selected dummy line are read out to the bit lines $BL_0$ and $\overline{BL_0}$. These data are transferred to the external bit lines $BL_{01}$ and $\overline{BL_{01}}$ through block selection gates $Q_5$ and $Q_6$. The NMOS sense amplifier NSA is activated, and the PMOS sense amplifier PSA is then activated. Subsequently, the bit lines $BL_{01}$ and $\overline{BL_{01}}$ are respectively set at Vcc and 0. The column selection signal $\overline{CSL_{i0}}$ selected by the column decoder $5_1$ is set at "H" level. As a result, the column selection gates $Q_1$ and $Q_2$ are set in an ON state. The data on the bit lines $BL_{01}$ and $\overline{BL_{01}}$ are read out to the I/O lines $I/O_{01}$ and $\overline{I/O_{01}}$ through these column selection gates $Q_1$ and $Q_2$. Since the precharge control signal $\overline{CEQ}$ is set at "H" level at the same time that the column selection signal $\overline{CSL_{i0}}$ is set at "HH" level, the second precharge circuit $12_1$ is set in an inactive state. Subsequently, the sense control signal $\overline{QSE_{01}}$ is set at "L" level so that the I/O sense amplifier $11_1$ is activated and the I/O lines $I/O_{01}$ and $\overline{I/O_{01}}$ are respectively set at Vcc and 0.

During this read operation, the block selection gates $Q_7$ and $Q_8$ of the other cell block $CA_1$ sharing the NMOS sense amplifier NSA with the selected cell block $CA_0$ is kept in an OFF state. That is, the cell block $CA_1$ is disconnected from the NMOS sense amplifier NSA. Although the block selection gates $Q_9$, $Q_{10}$, $Q_{11}$, and $Q_{12}$ of the other non-selected cell blocks $CA_2$ and $CA_3$ are in an ON state, their precharge potential states are free from breakdown. More specifically, while the cell block $CA_0$ is selected, both the block selection signals $\overline{BSL_2}$ and $\overline{BSL_3}$ are kept at "H" level, as shown in FIG. 5. Therefore, the control signal $\overline{IOS_{23}}$ of the first precharge circuit $13_2$ for (½)Vcc precharge is set at "H" level by the I/O buffer control circuit $14_2$ of the I/O buffer section $2_{12}$ of the I/O lines $I/O_{23}$ and $\overline{I/O_{23}}$ of the non-selected cell blocks $CA_2$ and $CA_3$. Similarly, the control signal $\overline{CEQ_{23}}$ of the second precharge circuit $12_2$ for Vcc precharge is kept at "H" level, and an activation signal $\overline{QSE_{23}}$ of the I/O sense amplifier $11_2$ is kept at (½) Vcc. That is, the data I/O lines $\overline{I/O_{23}}$ and $\overline{I/O_{23}}$ are kept at (½)Vcc. Therefore, the column selection gates $Q_3$ and $Q_4$ are set in an ON state by the same column selection signal $\overline{CSL_{i0}}$. Since both the data I/O lines $I/O_{23}$ and $\overline{I/O_{23}}$ are set at a precharge potential of (½)Vcc, no problems are posed even if the NMOS sense amplifier of the non-selected cell blocks $CA_2$ and $CA_3$ is connected to the data I/O lines $I/O_{23}$ and $\overline{I/O_{23}}$.

When the active cycle is completed and a precharge cycle is set, the I/O lines precharged to Vcc on active cycle are precharged to (½)Vcc again.

In the first embodiment, the precharge method is employed in the above-described manner, in which only I/O lines selected on active cycle are precharged to Vcc on the basis of the (½)Vcc precharge method. According to the DRAM of the first embodiment, therefore, both a reduction in power consumption and in chip area by the (½)Vcc precharge method and an increase in operation speed by the Vcc precharge method can be realized. Vcc precharge of a selected I/O line may be completed by the time that a column selection signal is activated. Therefore, a satisfactory margin can be set. That is, the method of this embodiment does not interfere with an increase in operation speed and does not require an especially large MOS transistor for Vcc precharge. The selected I/O line is precharged to (½)Vcc again when the active cycle is completed and a precharge cycle is set. This operation, however, is performed at the same time that other bit lines and I/O lines are precharged, and hence no extra time is required.

Figure 6:
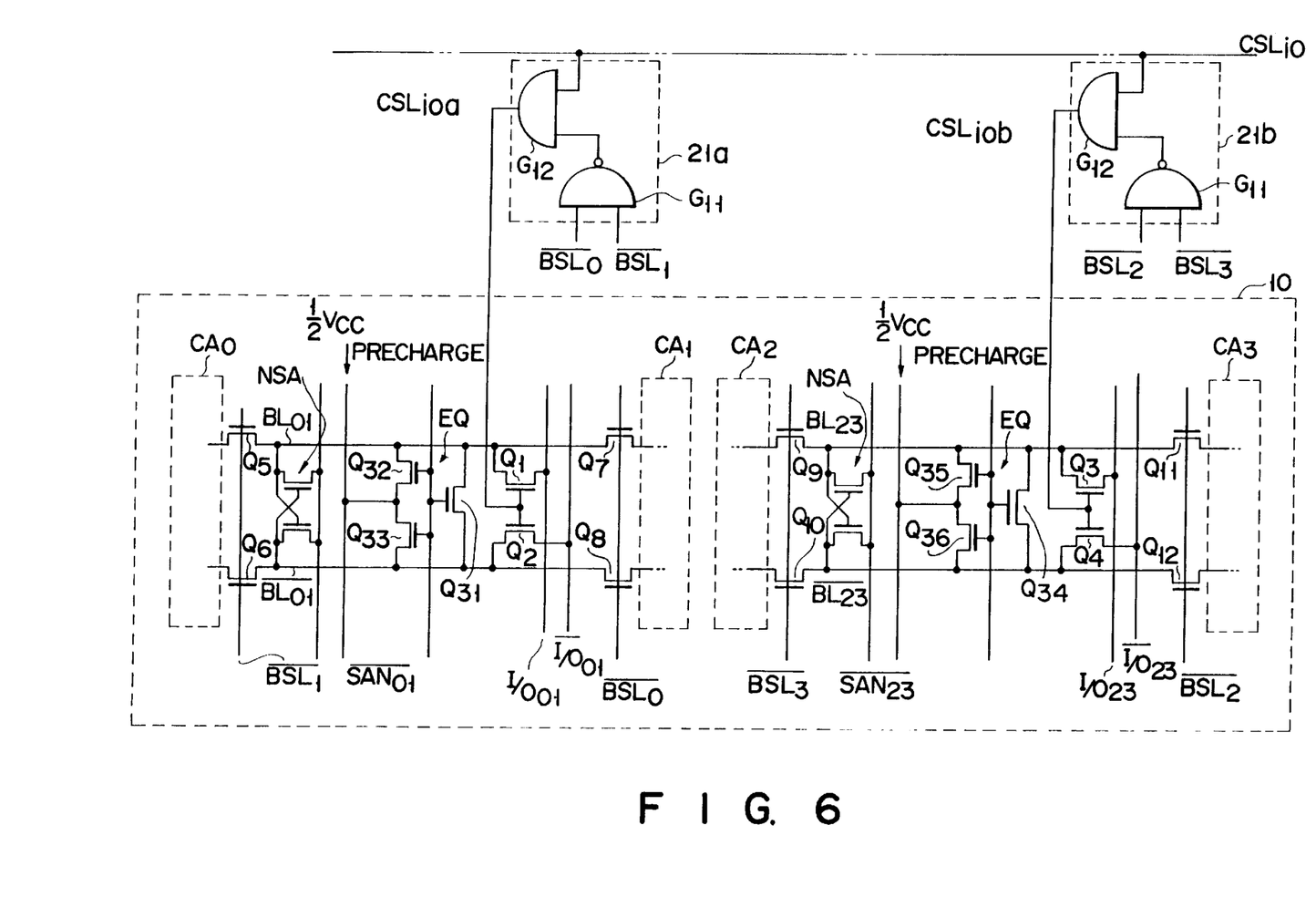
FIG. 6 is a circuit diagram showing a one-column portion of a subcell array of a DRAM according to the second embodiment of the present invention.

A DRAM of a divided bit line and common-Y decoder method according to the second embodiment of the present invention will be described below with reference to FIG. 6. The overall arrangement of the second embodiment is the same as that of the first embodiment described with reference to FIG. 1. FIG. 6 shows an arrangement of a one-column portion of the DRAM in correspondence with the arrangement shown in FIG. 2. The same reference numerals in FIG. 6 denote the same parts as in FIG. 6, and a detailed description thereof will be omitted.

In the first embodiment, the column selection signal lines $CSL_{i0}$ arranged across a plurality of cell blocks are directly connected to a plurality of column selection gates so as to simultaneously open/close the column selection gates. In order to perform Vcc precharge of only selected I/O lines of a plurality of data I/O lines, Vcc precharge and (½)Vcc precharge circuits for selectively driving data I/O lines are arranged. In contrast to this, the second embodiment includes selective drive circuits 21a and 21b for selectively driving column selection gates $Q_1$ and $Q_2$, and $Q_3$ and $Q_4$, as shown in FIG. 6. The selective drive circuit 21a is arranged between column selection signal lines CSLi0 arranged across a plurality of cell blocks and the column selection gates $Q_1$ and $Q_2$ to be driven thereby, whereas the selective drive circuit 21b is arranged between the column selection signal lines $CSL_{i0}$ and the column selection gates $Q_3$ and $Q_4$.

In the second embodiment, each of the selective drive circuits 21a and 21b is constituted by a two-input NAND gate $G_{11}$ and a two-input AND gate $G_{12}$. The NAND gate of one selective drive circuit 21a receives two block selection signals $\overline{BSL_0}$ and $\overline{BSL_1}$. The NAND gate of the other selective drive circuit 21b receives remaining two block selection signals $\overline{BSL_2}$ and $\overline{BSL_3}$. One input terminal of each AND gate $G_{12}$ is connected to a corresponding column selection signal line $CSL_{i0}$, and the other input terminal is connected to the output of a corresponding one of the NAND gates $G_{11}$. An output from the AND gate $G_{12}$ of one selective drive circuit 21a is used as a control signal for the column selection gates $Q_1$ and $Q_2$ arranged between the cell blocks $CA_0$ and $CA_1$. An output from the AND gate $G_{12}$ of the other selective drive circuit 21b is used as a control signal for the column selection gates $Q_3$ and $Q_4$.

Figure 7:
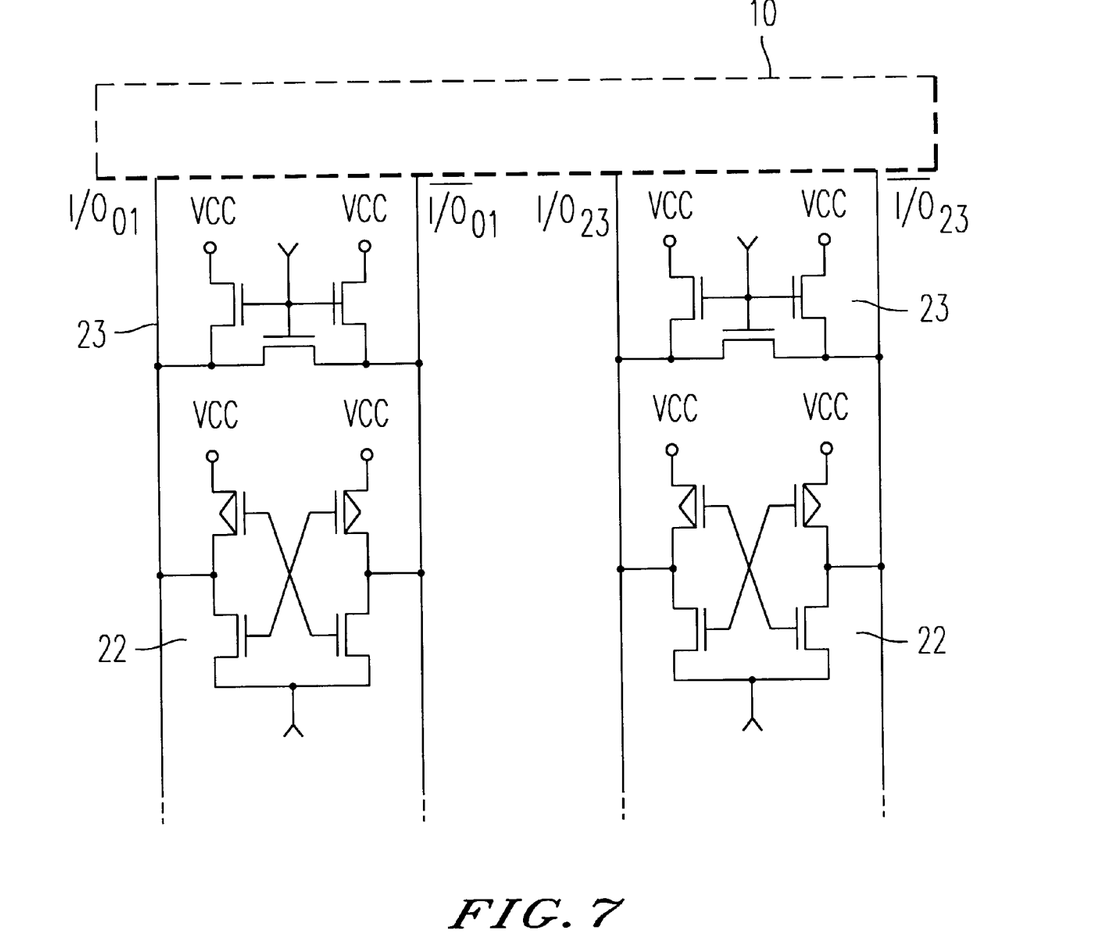
FIG. 7 is a circuit diagram showing a data I/O buffer section connected to data I/O lines of the DRAM.

Two pairs of data I/O lines $I/O_{01}$ and $\overline{I/O_{01}}$, and $I/O_{23}$ and $\overline{I/O_{23}}$ to which the bit lines of this subcell array 10 are connected are connected to an I/O line sense amplifier 22 and an I/O line precharge circuit 23 for Vcc precharge, as shown in FIG. 7.

In the second embodiment having the above-described arrangement, when one of the column selection signal lines $CSL_{i0}$ is selected on active cycle, all the column selection gates $Q_1$ and $Q_2$, and $Q_3$ and $Q_4$ are not simultaneously set in an ON state. A signal from the column selection signal line $CSL_{i0}$ is selectively supplied to the column selection gates $Q_1$ and $Q_2$ or $Q_3$ and $Q_4$ in accordance with selection of a cell block.

Figure 8:
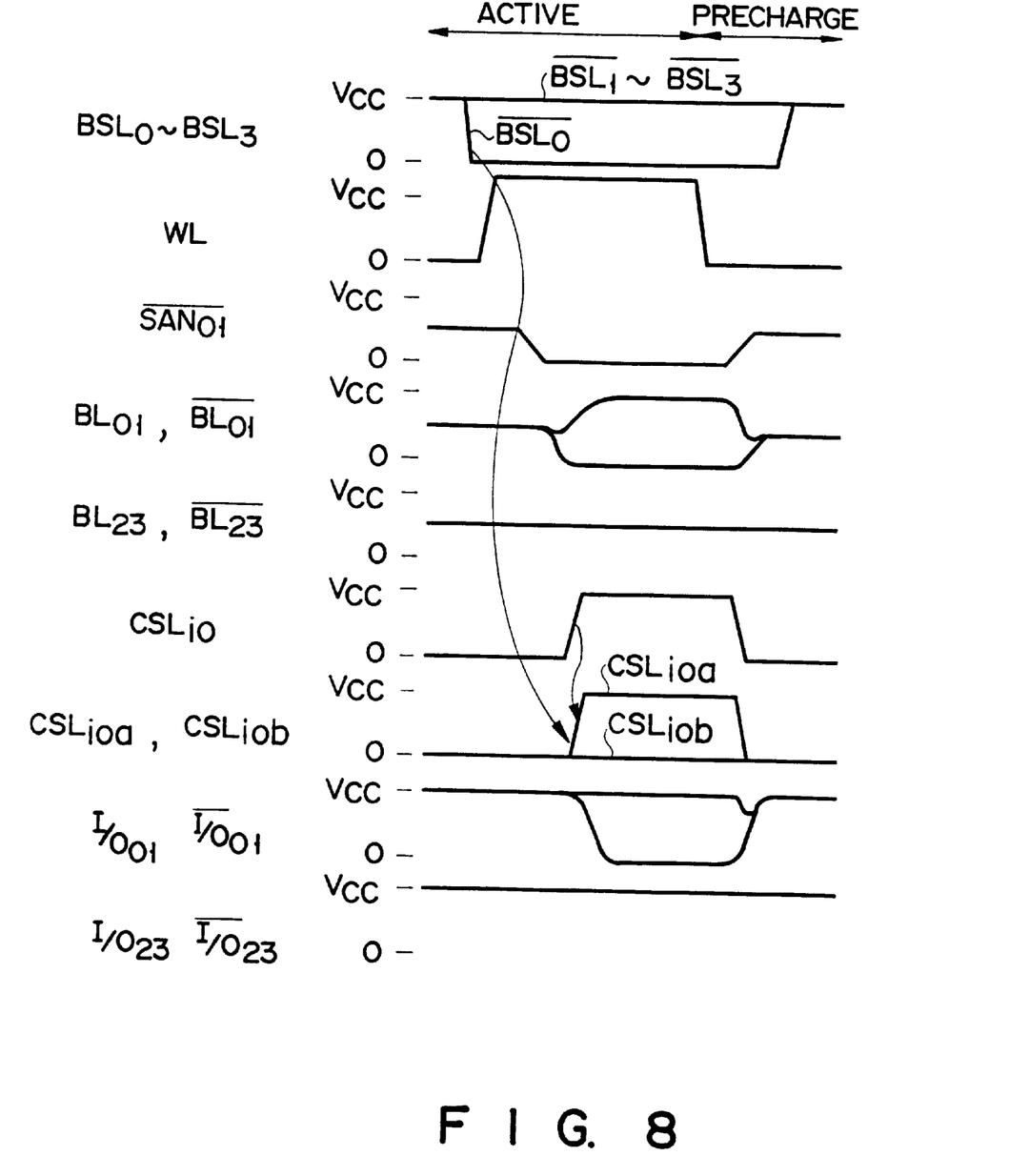
FIG. 8 is a timing chart for explaining an operation of the DRAM of the second embodiment.

An operation of the DRAM of this embodiment will be described in detail below with reference to FIG. 8. Similar to the description of the first embodiment, FIG. 8 shows the operation waveforms of the respective signals appearing when data is read out from the cell block $CA_0$. All the block selecting signals $\overline{BSL_0}$ to $\overline{BSL_3}$ are at "H" level before an active cycle is set. Therefore, all the cell block selection gates $Q_5$ to $Q_{12}$ are in an ON state. When a row address is determined, for example, the block selection signal $\overline{BSL_0}$ is set at "L" level. As a result, the block selection gates $Q_7$ and $Q_8$ are set in an OFF state. That is, the cell block $CA_1$ of the two cell blocks $CA_0$ and $CA_1$ sharing the NMOS sense amplifier NSA is disconnected from the NMOS sense amplifier NSA.

A word line WL selected by a row decoder is activated, and data of a selected memory cell in the cell block $CA_0$ and of a dummy cell are read out to the bit lines $BL_0$ and $\overline{BL_0}$. These data are transferred to external bit lines $BL_{01}$ and $\overline{BL_{01}}$ through the block selection gates $Q_5$ and $Q6$. The NMOS sense amplifier NSA is activated, and the PMOS sense amplifier PSA is then activated. As a result, the bit lines $BL_{01}$ and $\overline{BL_{01}}$ are respectively set at Vcc and 0. Subsequently, the column selection signal $CSL_{i0}$ selected by a column decoder $5_1$ is set at "H" level. Since the block selection signals $BSL_0$ and $BSL_1$ are respectively set at "H" level and "L" level at this time, an output control signal $CSL_{i0a}$ from the selective drive circuit 21a is set at "H" level. As a result, the column selection gates $Q_1$ and $Q_2$ are set in an ON state. Consequently, the data on the bit lines $BL_{01}$ and $\overline{BL_{01}}$ are read out to the I/O lines $I/O_{01}$ and $\overline{I/O_{01}}$ through the column selection gates $Q_1$ and $Q_2$, respectively.

As described above, during this read operation, the block selection gates $Q_7$ and $Q_8$ of the cell block $CA_1$, which share the NMOS sense amplifier NSA with the cell block $CA_0$, are kept in an OFF state. That is, the cell block $CA_1$ is disconnected from the NMOS sense amplifier NSA. On the other hand, the block selection gates $Q_9$, $Q_{10}$, $Q_{11}$, and $Q_{12}$ of the other non-selected cell blocks $CA_2$ and $CA_3$ are in an ON state. However, the precharge potentials of these portions are free from breakdown for the following reason. While the cell block $CA_0$ is selected, both the block selection signals $\overline{BSL_2}$ and $\overline{BSL_3}$ are kept at "H" level, as shown in FIG. 8. Thus, a control signal $CSL_{iob}$ obtained from the selective drive circuit 21b is kept at "L" level, and the column selection gates $Q_3$ and $Q_4$ of the cell blocks $CA_2$ and $CA_3$ are kept in an OFF state. Therefore, the bit lines $BL_{23}$ and $\overline{BL_{23}}$ precharged to (½)Vcc are not connected to the data I/O lines $I/O_{23}$ and $\overline{I/O_{23}}$ precharged to Vcc. As shown in FIG. 8, during this read operation, the bit lines $BL_{23}$ and $\overline{BL_{23}}$ are kept at (½)Vcc, whereas the data I/O lines $I/O_{23}$ and $\overline{I/O_{23}}$ are kept at Vcc.

As described above, in the second embodiment, (½)Vcc precharge of bit lines and Vcc precharge of I/O lines are simultaneously performed.

Figure 9:
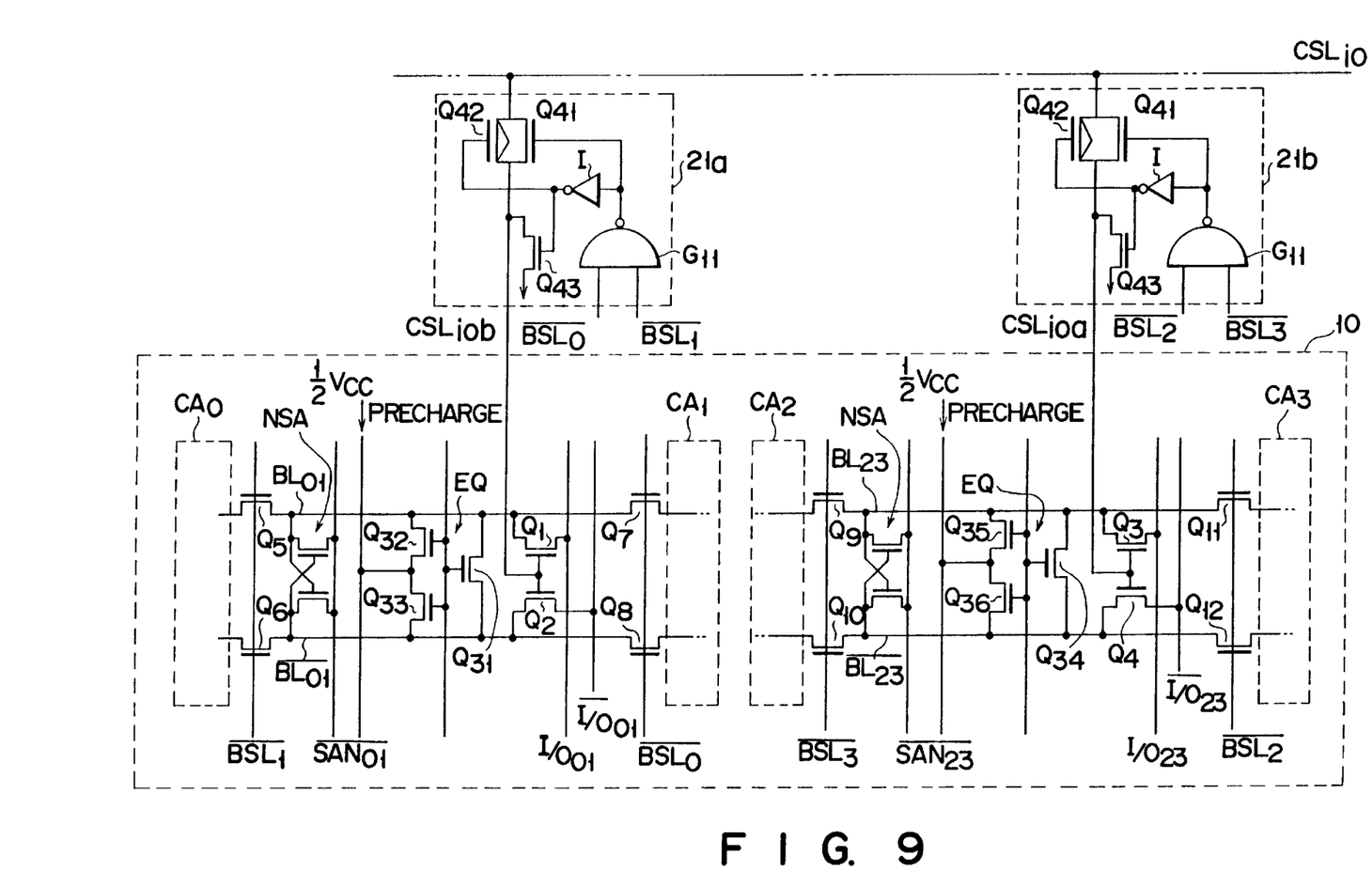
FIG. 9 is a circuit diagram showing a one-column portion of a subcell array of a DRAM according to the third embodiment of the present invention.

A DRAM according to the third embodiment of the present invention will be described below with reference to FIG. 9. In the third embodiment, the selective drive circuits 21a and 21b in FIG. 6 are modified. More specifically, a circuit portion corresponding to the AND gate $G_{12}$ in each of the selective drive circuits 21a and 21b is constituted by an inverter I, a transfer gate, and an n-channel MOS transistor Q43 for short-circuit. The transfer gate consists of an n-channel MOS transistor Q41 and a p-channel MOS transistor Q42. Other arrangements are the same as those in FIG. 6.

An operation of the third embodiment is the same as that of the second embodiment. Similar to the second embodiment, assume that block selection signals $\overline{BSL_0}$ to $\overline{BSL_3}$ are set in such a manner that the $\overline{BSL_0}$="L" level and $\overline{BSL_1}$=$\overline{BSL_2}$=$\overline{BSL_3}$="H" on active cycle. In this case, the output of a NAND gate Gll of one selective drive circuit 21a is at "H" level. Therefore, both the MOS transistors $Q_{41}$ and $Q_{42}$ are in an ON state, and the MOS transistor $Q_{43}$ is in an OFF state. A signal of "H"level from a column selection signal line $CSL_{i0}$ is transferred to column selection gates $Q_1$ and $Q_2$ through the selective drive circuit 21a. The output of the NAND gate $G_{11}$ of the other selective drive circuit 21b is set at "L" level. Consequently, the MOS transistors $Q_{41}$ and $Q_{42}$ are in an OFF state, and the MOS transistor $Q_{43}$ is in an OFF state. That is, the "H"-level signal from the column selection signal $CSL_{i0}$ is not transferred to the column selection gates $Q_3$ and $Q_4$.

As described above, since column selection gates connected to non-selected cell blocks are not rendered conductive, (½)Vcc precharge of bit lines and Vcc precharge of data I/O lines can be simultaneously performed.

In the third embodiment, the number of elements used for each of the selective drive circuits 21a and 21b is smaller than that in the second embodiment described with reference to FIG. 6. More specifically, in the second embodiment, the AND gate $G_{12}$ is normally constituted by six elements. In contrast to this, a portion corresponding to the AND gate $G_{12}$ in the third embodiment can be constituted by five elements, namely the three MOS transistors $Q_{41}$ to $Q_{43}$, and two transistors constituting the inverter I. Since the selective drive circuits 21a and 21b must be arranged for each column selection signal line, even a decrease in number of elements by one can greatly contribute a reduction in DRAM chip area.

The prevent invention is not limited to the above embodiments. For example, in the embodiments, a column decoder is located in substantially the center of a DRAM chip. However, such an layout can be changed as needed.

In addition, if NAND gates in selective drive circuits are arranged outside a cell array, the DRAM of the present invention can be integrated at a high density. Furthermore, in the embodiments, a bit line precharge potential is set to be (½)Vcc, and a data I/O line precharge potential is set to be two or more values such as Vcc and (½)Vcc in the first embodiment and to be Vcc only in the second and third embodiments. However, proper precharge potentials other than these values can be selected.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic random access memory, comprising:
   first and second memory cell arrays, each having a plurality of memory cells with each of the plurality of memory cells being connected to bit lines;
   a sense amplifier commonly provided for said first and second memory cell arrays;
   a first precharge circuit, commonly provided for said first and second memory cell arrays and driven by a first control signal;
   a column select gate transmitting data from/to said plurality of memory cells provided in said first and second memory cell arrays;
   a pair of data lines through which said data is transferred;
   a second precharge circuit connected to said pair of data lines and driven by a second control signal; and
   a third precharge circuit connected to said pair of data lines and driven by a third control signal.

2. The dynamic random access memory according to claim 1, wherein said second precharge circuit precharges said pair of data lines to a lower potential level than said third precharge circuit does.

3. The dynamic random access memory according to claim 1, wherein said second precharge circuit precharges said pair of data lines to a $V_{cc}/2$ level and said third precharge circuit precharges said pair of data lines to a $V_{cc}$ level.

4. A dynamic random access memory, comprising:
   first and second memory cell arrays, each having a plurality of memory cells with each plurality of memory cells being connected to bit lines;
   a sense namplifier commonly provided for said first and second memory cell arrays;
   a first precharge circuit commonly provided for said first and second memory cell arrays and driven by a first control signal;
   a column select gate transmitting data from/to said plurality of memory cells provided in said first and second memory cell arrays;
   a first pair of data lines through which said data is transferred;
   a second precharge circuit connected to said first pair of data lines and driven by a second control signal;
   a third precharge circuit connected to said first pair of data lines and driven by a third control signal;
   a second pair of data lines through which said data transmitted from said first pair of data lines is transferred; and
   a fourth precharge circuit connected to said second pair of data lines and driven by a fourth control signal, said fourth precharge circuit precharging said second pair of data lines.

5. The dynamic random access memory according to claim 4, wherein said second precharge circuit precharges said first pair of data lines to a lower potential level than said third precharge circuit does.

6. The dynamic random access memory according to claim 4, wherein said second precharge circuit precharges said first pair of data lines to a $V_{cc}/2$ level and said third precharge circuit precharges said first pair of data lines to a $V_{cc}$ level.

7. The dynamic random access memory according to claim 6, wherein said third and fourth precharge circuits precharge said first and second pairs of data lines to a same level.

8. A dynamic random access memory, comprising:
   first and second memory cell arrays, each having a plurality of memory cells with each plurality of memory cells being connected to bit lines;
   a sense amplifier commonly provided for said first and second memory cell arrays;
   a first precharge circuit commonly provided for said first and second memory cell arrays and driven by a first control signal;
   a column select gate transmitting data from/to said plurality of memory cells provided in said first and second memory cell arrays;
   a first pair of data lines through which said data is transferred;
   a second precharge circuit connected to said first pair of data lines and driven by a second control signal, said second precharge circuit precharging said first pair of data lines to a first potential;
   a second pair of data lines through which data from said first pair of data lines is transferred; and
   a third precharge circuit, connected to said second pair of data lines and driven by a third control signal, said third precharge circuit precharging said second pair of data lines to a second potential.

9. The dynamic random access memory according to claim 8, wherein said second precharge circuit precharges said first pair of data lines to a lower potential level than said third precharge circuit precharges said second pair of data lines.

10. The dynamic random access memory according to claim 8, wherein said second precharge circuit precharges said first pair of data lines to a $V_{cc}/2$ level and said third precharge circuit precharges said second pair of data lines to a $V_{cc}$ level.

* * * * *